United States Patent
Iwai

(10) Patent No.: US 11,551,943 B2
(45) Date of Patent: *Jan. 10, 2023

(54) PLASMA PROCESSING APPARATUS

(71) Applicant: Panasonic Intellectual Property Management Co., Ltd., Osaka (JP)

(72) Inventor: Tetsuhiro Iwai, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 133 days.

This patent is subject to a terminal disclaimer.

(21) Appl. No.: 17/013,325

(22) Filed: Sep. 4, 2020

(65) Prior Publication Data

US 2020/0402822 A1    Dec. 24, 2020

Related U.S. Application Data

(60) Continuation of application No. 15/804,968, filed on Nov. 6, 2017, now Pat. No. 10,796,932, which is a
(Continued)

(30) Foreign Application Priority Data

Oct. 12, 2007   (JP) ................................ 2007-266337

(51) Int. Cl.
  *H01L 21/67*    (2006.01)
  *H01J 37/32*    (2006.01)
  (Continued)

(52) U.S. Cl.
  CPC .. *H01L 21/67069* (2013.01); *H01J 37/32623* (2013.01); *H01J 37/32642* (2013.01);
  (Continued)

(58) Field of Classification Search
  None
  See application file for complete search history.

(56) References Cited

U.S. PATENT DOCUMENTS 5,389,182 A   2/1995  Mignardi
5,779,803 A   7/1998  Kurono et al.
(Continued)

FOREIGN PATENT DOCUMENTS

DE   602004003254 T2    3/2007
JP      2002190463 A    7/2002
JP      2006066602 A    3/2006

OTHER PUBLICATIONS

Machine Translation of JP 2006-066602, published Sep. 3, 2006, 20 pages (Year: 2006).*

(Continued)

*Primary Examiner* — Keath T Chen
*Assistant Examiner* — Margaret Klunk
(74) *Attorney, Agent, or Firm* — McDermott Will & Emery LLP

(57) ABSTRACT

Disclosed is a plasma processing device that provides an object to be treated with plasma treatment. A wafer as an object to be treated, which is attached on the upper surface of adhesive sheet held by a holder frame, is mounted on a stage. In a vacuum chamber that covers the stage therein, plasma is generated, by which the wafer mounted on the stage undergoes plasma treatment. The plasma processing device contains a cover member made of dielectric material. During the plasma treatment on the wafer, the holder frame is covered with a cover member placed at a predetermined position above the stage, at the same time, the wafer is exposed from an opening formed in the center of the cover member.

10 Claims, 12 Drawing Sheets

Related U.S. Application Data division of application No. 15/188,630, filed on Jun. 21, 2016, now Pat. No. 9,842,750, which is a division of application No. 13/938,347, filed on Jul. 10, 2013, now Pat. No. 9,401,286, which is a continuation of application No. 12/680,817, filed as application No. PCT/JP0208/002851 on Oct. 9, 2008, now Pat. No. 8,513,097.

(51) Int. Cl.
  *H01L 21/687* (2006.01)
  *H01L 21/3065* (2006.01)
  *H01L 21/683* (2006.01)
  *H01L 21/78* (2006.01)

(52) U.S. Cl.
  CPC .... *H01L 21/3065* (2013.01); *H01L 21/67092* (2013.01); *H01L 21/67132* (2013.01); *H01L 21/6831* (2013.01); *H01L 21/68735* (2013.01); *H01L 21/68785* (2013.01); *H01L 21/78* (2013.01)

(56) References Cited

U.S. PATENT DOCUMENTS

| | | | |
|---|---|---|---|
| 6,328,808 B1 | 12/2001 | Tsai et al. | |
| 6,340,639 B1 | 1/2002 | Arita et al. | |
| 6,406,979 B2 | 6/2002 | Fischer et al. | |
| 7,708,860 B2 | 5/2010 | Arita et al. | |
| 8,513,097 B2* | 8/2013 | Iwai | H01L 21/78 438/464 |
| 9,401,286 B2* | 7/2016 | Iwai | H01L 21/68735 |
| 9,842,750 B2* | 12/2017 | Iwai | H01L 21/3065 |
| 10,796,932 B2* | 10/2020 | Iwai | H01L 21/3065 |
| 2002/0086531 A1 | 6/2002 | Ke et al. | |
| 2007/0057378 A1* | 3/2007 | Arai | B23K 26/40 257/777 |
| 2007/0065597 A1 | 3/2007 | Kaido et al. | |
| 2007/0077731 A1* | 4/2007 | Masuda | B28D 5/0029 438/460 |
| 2007/0095477 A1 | 5/2007 | Arita et al. | |
| 2010/0009519 A1 | 1/2010 | Seddon et al. | |

OTHER PUBLICATIONS

Non-Final Office Action issued in corresponding U.S. Appl. No. 15/804,968, dated Mar. 12, 2019.
Final Office Action issued in corresponding U.S. Appl. No. 15/804,968, dated Sep. 16, 2019.
Non-Final Office Action issued in corresponding U.S. Appl. No. 15/804,968, dated Feb. 20, 2020.
Notice of Allowance issued in corresponding U.S. Appl. No. 15/804,968, dated Jun. 5, 2020.
International Search Report for PCT/JP2008/002851, dated Dec. 2, 2008.
Notice of Allowance issued in related parent U.S. Appl. No. 15/188,630 dated Aug. 11, 2017.
Final Office Ation issued in related parent U.S. Appl. No. 15/188,630 dated May 9, 2017.
Non-Final Office Action issued in related parent U.S. Appl. No. 15/188,630 dated Nov. 7, 2016.
Non-Final Office Action issued in related parent U.S. Appl. No. 15/804,968, dated Mar. 12, 2019.
Final Office Action issued in related parent U.S. Appl. No. 15/804,968, dated Sep. 16, 2019.
Non-Final Office Action issued in related parent U.S. Appl. No. 15/804,968, dated Feb. 20, 2020.
Notice of Allowance issued in related parent U.S. Appl. No. 15/804,968, dated Jun. 5, 2026.

* cited by examiner

PLASMA PROCESSING APPARATUS

This application is a continuation of U.S. patent application Ser. No. 15/804,968, filed Nov. 6, 2017, which is a divisional of U.S. patent application Ser. No. 15/188,630, filed Jun. 21, 2016, now U.S. Pat. No. 9,842,750, which is a divisional of U.S. patent application Ser. No. 13/938,347, filed on Jul. 10, 2013, now U.S. Pat. No. 9,401,286, which is a continuation of U.S. patent application Ser. No. 12/680,817, filed Mar. 30, 2010, now U.S. Pat. No. 8,513,097, which is a U.S. National Phase Application of PCT International Application PCT/JP2008/002851, filed Oct. 9, 2008, which claims the benefits of Japanese Patent Application No. 2007-266337, filed on Oct. 12, 2007, the entire disclosures of which are incorporated herein by reference.

TECHNICAL FIELD

The present invention relates to a plasma processing device that carries out a plasma treatment on a to-be-treated object mounted on a stage in a vacuum chamber.

BACKGROUND ART

In plasma treatment by a plasma processing device, an object to be treated, such as a semiconductor wafer, is mounted on a stage in a vacuum chamber, and plasma is generated in the vacuum chamber, so that the object undergoes plasma treatment. Specifically, an object to be treated undergoes dicing and cleaning. As a well known plasma treatment method, an adhesive sheet is disposed under the object to be treated, and at the same time, a holder frame is attached on the periphery of the adhesive sheet. The object, with the holder frame attached, undergoes a series of plasma treatment. Having the holder frame, the object is easily loaded into the chamber and unloaded from the chamber. At the same time, the holder frame enhances handling of the object after the plasma treatment. In most cases, such a holder frame is made of metal, such as stainless steel, in terms of durability to operating environment. The plasma processing device described above is disclosed in patent documents 1 and 2.

However, when an object with the holder frame attached undergoes plasma treatment, not only the object but also the holder frame and the adhesive sheet are exposed to plasma in the vacuum chamber. The plasma generated in the vacuum chamber concentrates at the metallic holder frame, rather than the object that should be treated. As a result, performance of plasma treatment on the object is degraded.

Patent Document 1: Japanese Unexamined Patent Application Publication No. 2006-066602;

Patent Document 2: Japanese Unexamined Patent Application Publication No. 2002-190463

SUMMARY OF THE INVENTION

When an object to be treated with a holder frame undergoes plasma treatment, the plasma processing device of the present invention prevents concentration of plasma at the holder frame, enhancing performance of the plasma treatment.

According to the plasma processing device of the present invention, an object to be treated, which is attached on the upper surface of an adhesive sheet held by a holder frame, is mounted on a stage in a vacuum chamber. Plasma is generated in the vacuum chamber that covers the stage therein, by which the object on the stage undergoes plasma treatment. The device has a cover member made of dielectric material.

In the present invention, during the plasma treatment on the object mounted on the stage, the holder frame that holds the adhesive sheet is covered with the dielectric cover member placed at a predetermined position above the stage, at the same time, the object is exposed from an opening in the center of the cover. The cover structured above prevents plasma generated in the vacuum chamber from concentrating at the holder frame; on the other hand, the plasma treatment on the object proceeds with no obstruction. As a result, performance of the plasma treatment on the object with the holder frame is improved. The adhesive sheet has an exposed area between the outer periphery of the object and the inner periphery of the holder frame. The cover member covers at least a section above the exposed area of the adhesive sheet, reducing the area exposed to plasma. This accordingly reduces thermal distortion of the adhesive sheet, enhancing easy handling of the object after plasma treatment.

Figure 1:
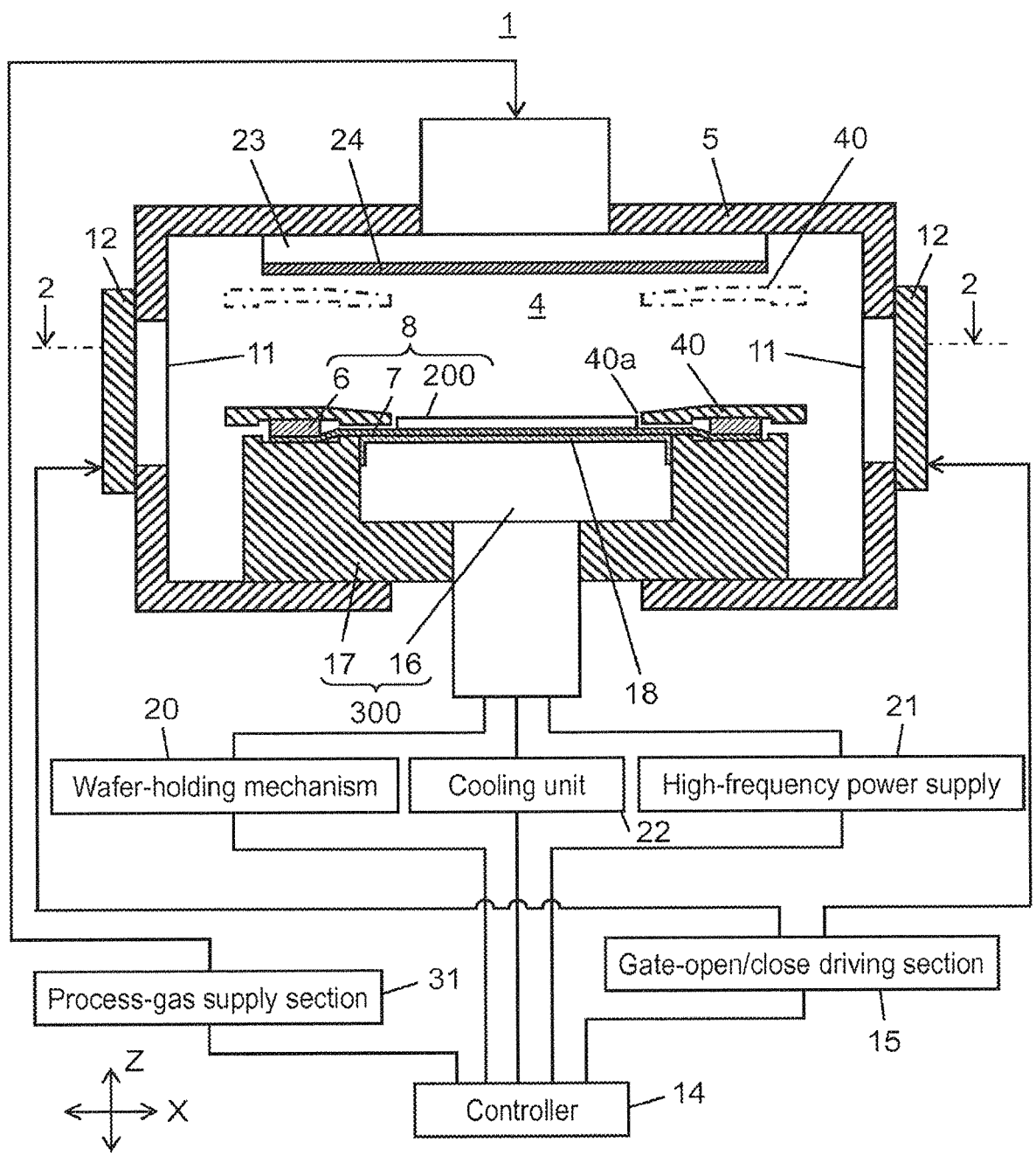
FIG. 1 is a sectional front view of a plasma processing device in accordance with an exemplary embodiment of the present invention.

REFERENCE MARKS IN THE DRAWINGS 1 plasma processing device
200 semiconductor wafer (object to be treated)
2a outer periphery of wafer (outer periphery of object to be treated)
300 stage
5 vacuum chamber
6 holder frame
6a inner periphery of holder frame
7 adhesive sheet
8 wafer with holder frame
18 dielectric film (film member)
33 elevating cylinder (elevating mechanism)
40 cover member
40a opening

DETAILED DESCRIPTION OF THE PREFERRED EMBODIMENTS

First Exemplary Embodiment

An exemplary embodiment of the present invention is described hereinafter with reference to the accompanying drawings.

Figure 2:
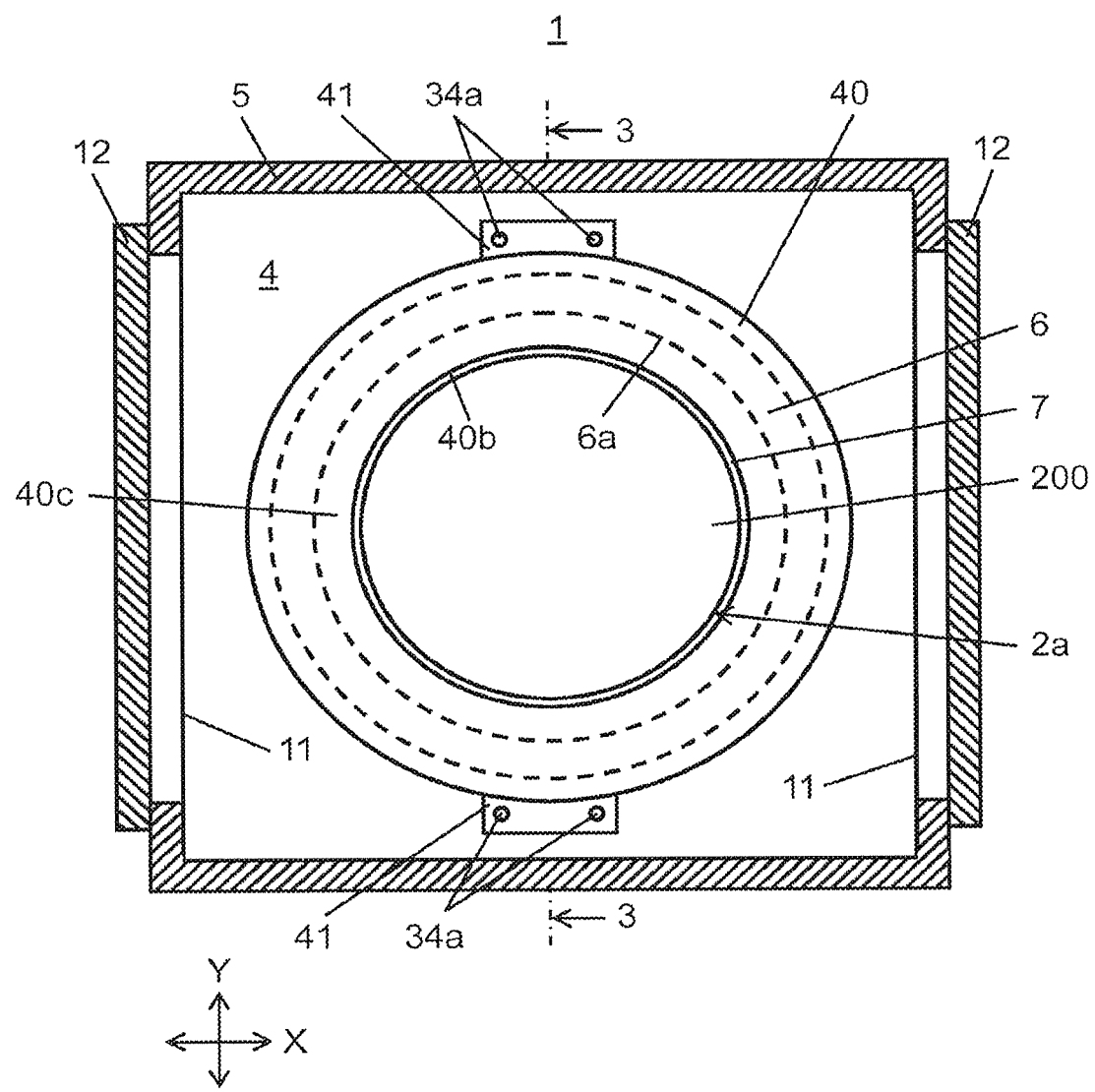
FIG. 2 is a sectional plan view of the plasma processing device in accordance with the exemplary embodiment of the present invention.
Figure 3:
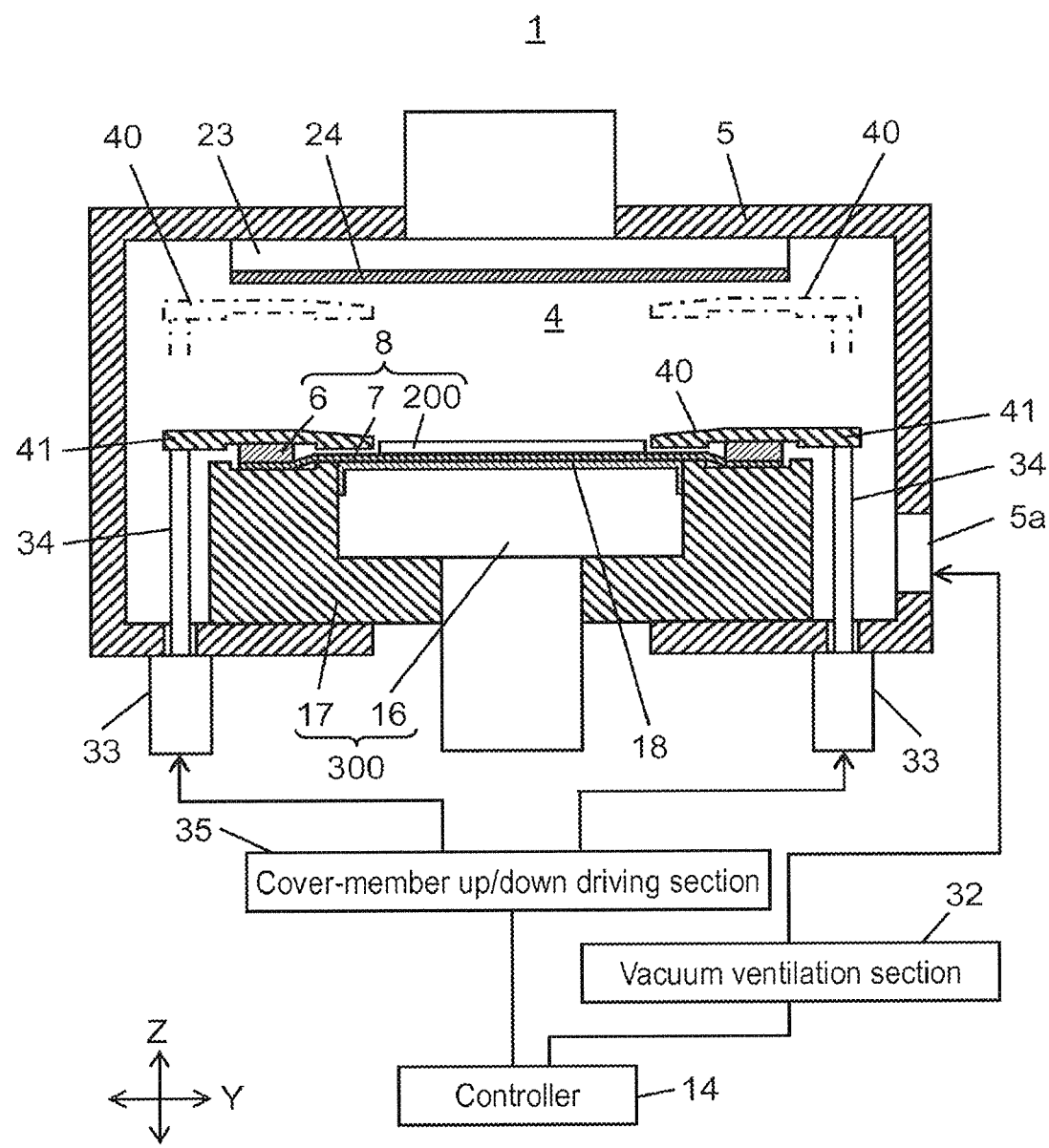
FIG. 3 is a sectional side view of the plasma processing device in accordance with the exemplary embodiment of the present invention.

FIG. 1 is a sectional front view of the plasma processing device in accordance with the exemplary embodiment of the present invention. FIG. 2 is a sectional plan view of the plasma processing device in accordance with the exemplary embodiment. FIG. 3 is a sectional side view of the plasma processing device in accordance with the exemplary embodiment.

As is shown in FIGS. 1, 2 and 3, plasma processing device 1 has stage 300, on which semiconductor wafer (hereinafter referred to simply as a wafer) 200 as an object to be treated is mounted, and vacuum chamber 5 that covers stage 300 and forms enclosed space 4 therein. FIG. 2 is a sectional view taken along the line 2-•2 of FIG. 1. FIG. 3 is a sectional view taken along the line 3-3 of FIG. 2.

Wafer 200 is attached on the upper surface of adhesive sheet 7 whose periphery is held by holder frame 6 made of metal, for example, made of stainless steel. With the condition above maintained, wafer 200 is mounted on stage 300 with the treatment surface, on which a circuit is to be formed, faced up. Holder frame 6 is formed into a ring shape having an inner diameter larger than the outer diameter of wafer 200. Hereinafter, wafer 200, which is attached on the upper surface of adhesive sheet 7 held by holder frame 6, is referred to as framed wafer 8.

Figure 4A:
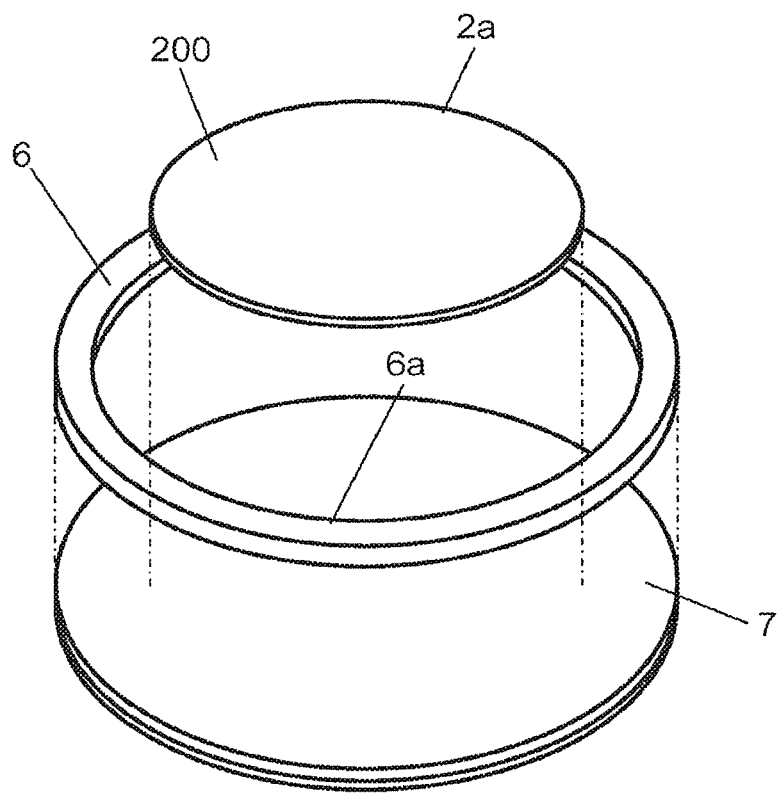
FIG. 4A is an exploded perspective view of a wafer and a holder frame of the plasma processing device in accordance with the exemplary embodiment of the present invention.
Figure 4B:
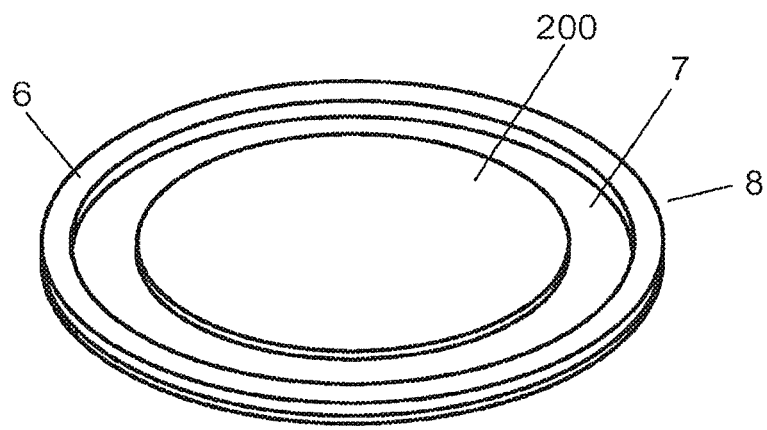
FIG. 4B is an exploded perspective view of a wafer, with the holder frame attached, of the plasma processing device in accordance with the exemplary embodiment of the present invention.

FIG. 4A is an exploded perspective view of a wafer and a holder frame of the plasma processing device in accordance with the exemplary embodiment of the present invention. FIG. 4B is an exploded perspective view of the wafer, with the holder frame attached, of the plasma processing device in accordance with the exemplary embodiment of the present invention. As shown in FIGS. 1 through 3, 4A, and 4B, vacuum chamber 5 has two mouths 11 for loading and unloading framed wafer 8 therethrough, and respective two gates 12 for opening and closing mouths 11. Each of two gates 12 moves up or down with respect to vacuum chamber 5 by operation control of controller 14 via gate-open/close driving section 15 so as to open or close the respective mouth of mouths 11.

Stage 300 has lower electrode 16 and table 17 disposed on the periphery side of lower electrode 16. Both the upper surfaces of lower electrode 16 and of table 17 are flat and substantially level with each other. Lower electrode 16 has an outer shape larger than that of wafer 200. When framed wafer 8 is mounted on stage 300 in a manner that the center of framed wafer 8 (i.e., the center of wafer 200) substantially aligns with the center of stage 300 (i.e., the center of lower electrode 16) in a vertical direction, wafer 200 fits in a predetermined section on the upper surface of lower electrode 1.6, and holder frame 6 fits in a predetermined section on table 17 (see FIG. 1). The upper surface of lower electrode 16 is covered with dielectric film 18 made of a dielectric film member.

Figure 5:
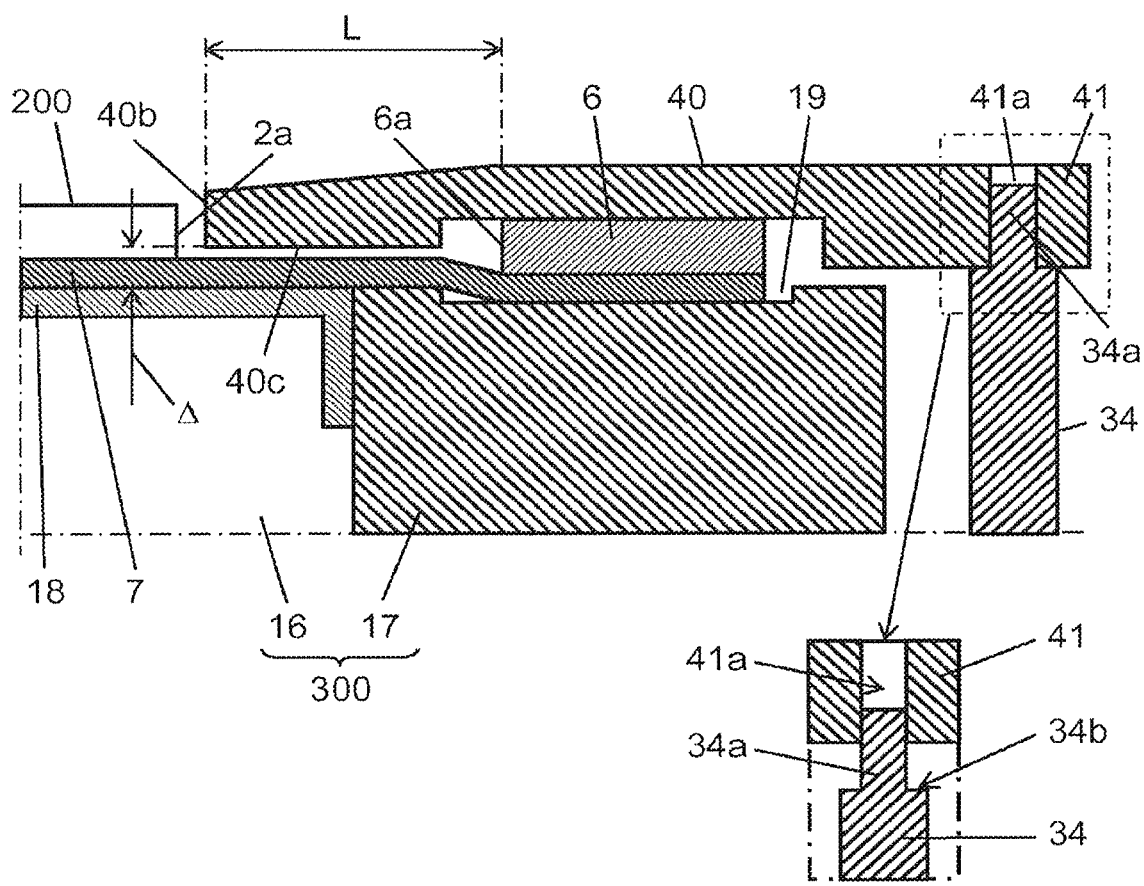
FIG. 5 is a sectional side view, partly enlarged, of the plasma processing device in accordance with the exemplary embodiment of the present invention.

FIG. 5 is a sectional side view, partly enlarged, of the plasma processing device in accordance with the exemplary embodiment of the present invention. In FIG. 5, groove 19 of a ring shape is formed on the upper surface of table 17. The position and the size of groove 19 are determined to be met with holder frame 6 of framed wafer 8 fitted in from the upper direction when framed wafer 8 is mounted on stage 300 in a manner that the center of framed wafer 8 (i.e., the center of wafer 200) substantially aligns with the center of stage 300 (i.e., the center of lower electrode 16) in a vertical direction.

Lower electrode 16 is connected to wafer-holding mechanism 20 (see FIG. 1). Wafer-holding mechanism 20 is formed of a vacuum chuck, an electrostatic suction mechanism, and the like. Controller 14 effects control of wafer-holding mechanism 20 so that lower electrode 16 holds wafer 200 mounted thereon. High-frequency power supply 21 and cooling unit 22 are connected to lower electrode 16. Controller 14 effects control of high-frequency power supply 21 so as to apply high-frequency voltage to lower electrode 16. Controller 14 effects control of cooling unit 22 so as to circulate a coolant in lower electrode 16.

In vacuum chamber 5, upper electrode 23 is disposed above lower electrode 1.6. Upper electrode 23 is connected to process-gas supply section 31 that supplies process gas to vacuum chamber 5. Specifically, process-gas supply section 31 functions by operation control of controller 14 and supplies process gas required for the plasma treatment, such as an oxygen-based gas and a fluorine-based gas, to vacuum chamber 5 via upper electrode 23. Vacuum exhaust-vent 5a, which is disposed at a lower section of vacuum chamber 5 (see FIG. 3), is connected to vacuum ventilation section 32. Vacuum ventilation section 32 functions by operation control of controller 14 and exhausts air, with a suction force, from vacuum chamber 5 to maintain vacuum chamber 5 under vacuum.

Porous plate 24 is disposed on the lower surface of upper electrode 23. Process gas, which is supplied from process-gas supply section 31 into upper electrode 23, passes through porous plate 24, and evenly sprayed over wafer 200 mounted on stage 300.

In vacuum chamber 5, a pair of elevating cylinders 33 is disposed in the horizontal direction (i.e., the Y-axis direction) perpendicular to the direction (i.e., the X axis direction) of oppositely disposed two mouths 11 (see FIGS. 1 and 3). Elevating cylinders 33 have piston rods 34, each of which extends in the up-and-down direction in vacuum chamber 5, with the tip faced up. Controller 1.4 effects control of cover-member up/down driving section 35 so that piston rods 34 of elevating cylinders 33 move up and down in synchronization with each other.

Cover member 40 made of dielectric material (for example, ceramics) is disposed above table 17 of stage 300.

Cover member 40 is formed into a ring shape and has round opening 40a at the center thereof. Cover member 40 has a shape and size such that wafer 200 is exposed from opening 40a; at the same time, the upper surface of holder frame 6 is thoroughly covered when cover member 40 is put on framed wafer 8.

In FIGS. 2, 3 and 5, cover member 40 has a pair of tabs 41 oppositely disposed in the Y-axis direction on the outer periphery. Each of tabs 41 is connected to the tip (the top end) of each of piston rods 34 that is disposed just below each tab. A synchronous up-and-down movement of piston rods 34 of elevating cylinders 33 allows cover member 40 to go upward and downward, with its horizontal state maintained, above stage 300.

When elevating cylinders 33 move piston rods 34 to the upper limit position, cover member 40 is located at the highest position just below upper electrode 23 (see FIGS. 1 and 3 where the position of cover member 40 is indicated by the single dot lines). On the other hand, when framed wafer 8 is mounted on stage 300, that is, when elevating cylinders 33 move piston rods 34 down to the lower limit position, cover member 40 is located at the "holder frame contact" position where cover member 40 makes contact with the upper surface of holder frame 6 of framed wafer 8 from the upper direction. When framed wafer 8 is not mounted on stage 300, cover member 40 is located at the "stage contact" position where cover member 40 makes contact with the upper surface of stage 300 from the upper direction.

As is shown in FIGS. 2 and 5, the tip of each of piston rods 34 has a plurality of joint protrusions 34a that protrude upward. On the other hand, each of tabs 41 of cover member 40 has a plurality of joint holes 41a that vertically pass through the tab. Piston rods 34 are connected with tabs 41 of cover member 40 in a manner that joint protrusions 34a are upwardly inserted into joint holes 41a until abutment surface 34b at the root of joint protrusions 34a abuts against the lower surface of tabs 41. With the structure above, when cover member 40 makes contact with the upper surface of framed wafer 8 or stage 300 while piston rods 34 are moving from the upper limit position toward the lower limit position, cover member 40 stops at the contact position. However, abutment surface 34b of piston rods 34 downwardly goes away from tabs 41, which breaks connection between cover member 40 and piston rods 34. Piston rods 34 move down to the lower limit position. At that time, joint protrusions 34a of piston rods 34 go down through joint holes 41a of tabs 41.

In the structure above, elevating cylinders 33 are positioned such that joint protrusions 34a of piston rods 34 don't downwardly come off joint holes 41a of tabs 41 even when downwardly moving cover member 40 makes contact with holder frame 6 of framed wafer 8 and piston rods 34 move down to the lower limit position. Therefore, when piston rods 34 of elevating cylinders 33 move upwardly from the lower limit position, abutment surface 34b of piston rods 34 abut against the lower surface of tabs 41 from the lower direction, and cover member 40 is lifted up by piston rods 34.

Figure 6A:
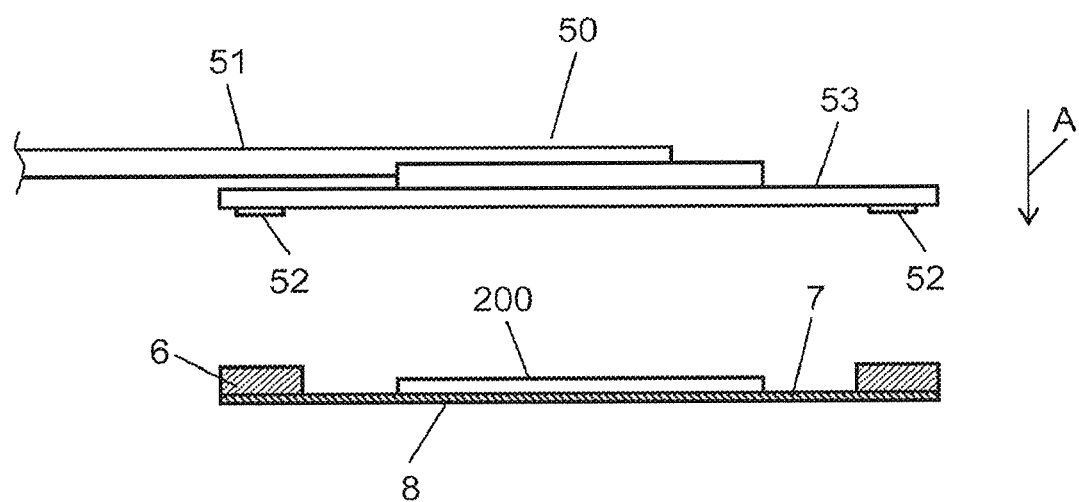
FIG. 6A is a side view of a suction carrier tool and a wafer with a holder frame of the plasma processing device in accordance with the exemplary embodiment of the present invention.
Figure 6B:
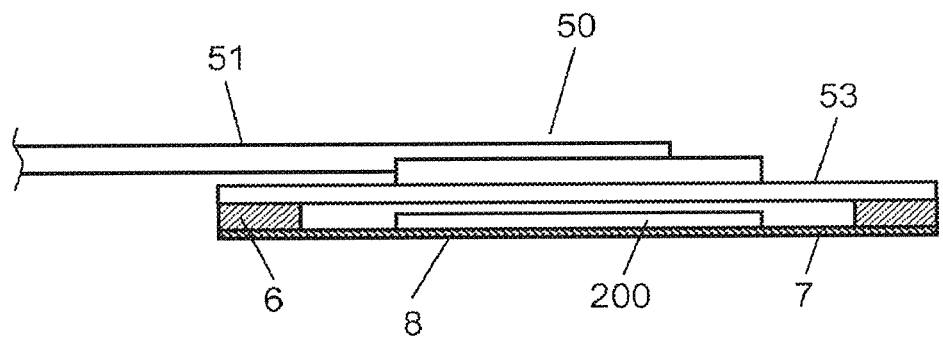
FIG. 6B is a side view of the suction carrier tool and the wafer with the holder frame of the plasma processing device in accordance with the exemplary embodiment of the present invention.

Each of FIGS. 6A and 6B is a side view of a suction carrier tool and a framed wafer of the plasma processing device in accordance with the exemplary embodiment of the present invention. In FIGS. 6A and 6B, suction carrier tool 50, which is used for loading framed wafer 8 into vacuum chamber 5 and unloading it therefrom, has holder 51 and disc-shaped wafer holder 53. Holder 51 is held by an operator or an additionally disposed wafer loading/unloading device. Wafer holder 53, which has a plurality of sucking sections 52 on the lower surface, is disposed at the tip of holder 51. Wafer holder 53 has a size that covers holder frame 6 of framed wafer 8 therein. Sucking sections 52 are connected to a vacuum source (not shown) via a vacuum passage (also not shown) that runs through wafer holder 53 and holder 51. After framed wafer 8 is put on a flat plane, suction carrier tool 50 located above wafer 8 is moved down close to framed wafer 8 (in a direction indicated by arrow A shown in FIG. 6A) in a manner that wafer holder 53 meets with holder frame 6. At the position where sucking sections 52 make contact with the upper surface of holder frame 6, exhausting air from the vacuum passage by vacuum suction of the vacuum source allows holder frame 6 of framed wafer 8 to cling to sucking section 52 of suction carrier tool 50, as is shown in FIG. 68. With the state above maintained, suction carrier tool 50 carries framed wafer 8 to a predetermined place without making contact with the upper surface (on which a circuit is to be formed) of wafer 200.

Next will be described the procedures of the plasma treatment of wafer 200 by plasma processing device 1 of the embodiment.

First, controller 14 effects control of cover-member up/down driving section 35 so that piston rods 34 of elevating cylinders 33 move up to the upper limit position to lift cover member 40 to the highest position.

After cover member 40 is placed at the highest position, framed wafer 8 is attached with suction force to suction carrier tool 50 outside vacuum chamber 5. Controller 14 effects control of gate-open/close driving section 1.5 so as to move down gate 1.2 disposed at one of mouths 11 and to open the mouth.

Figure 7:
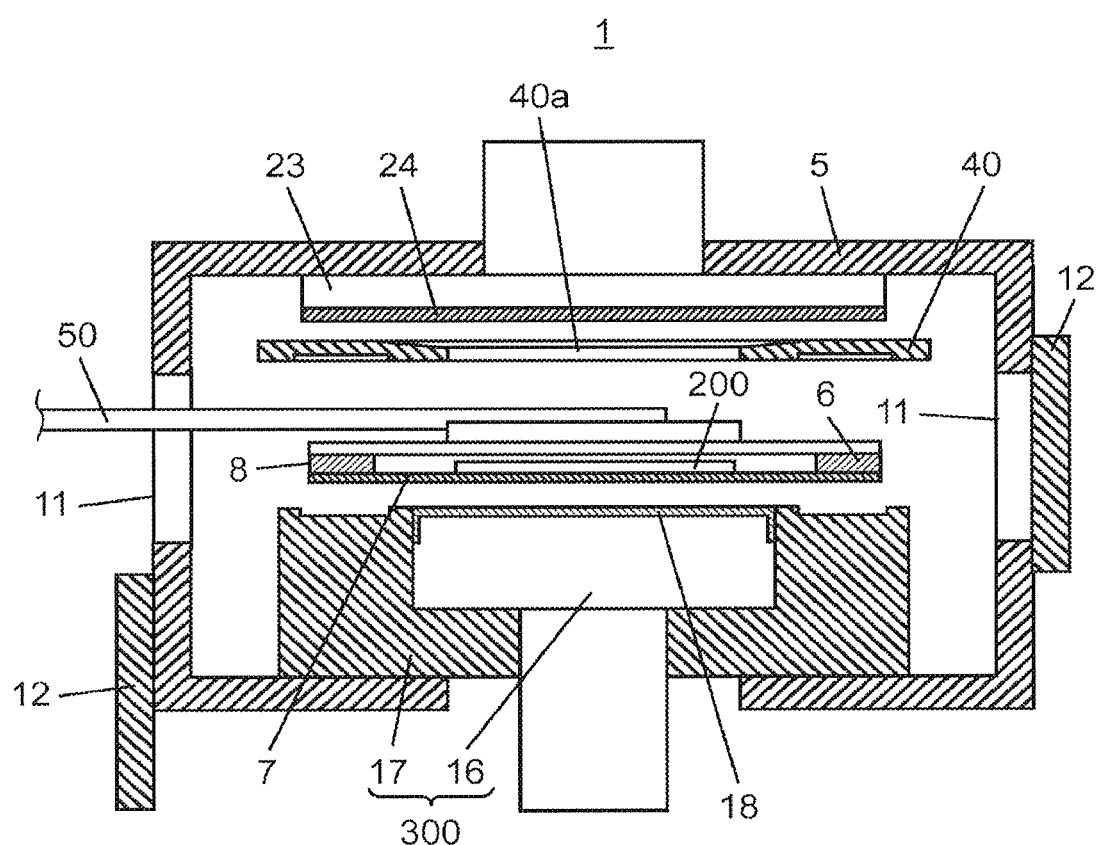
FIG. 7 is a sectional front view of the plasma processing device in accordance with the exemplary embodiment of the present invention.
Figure 8:
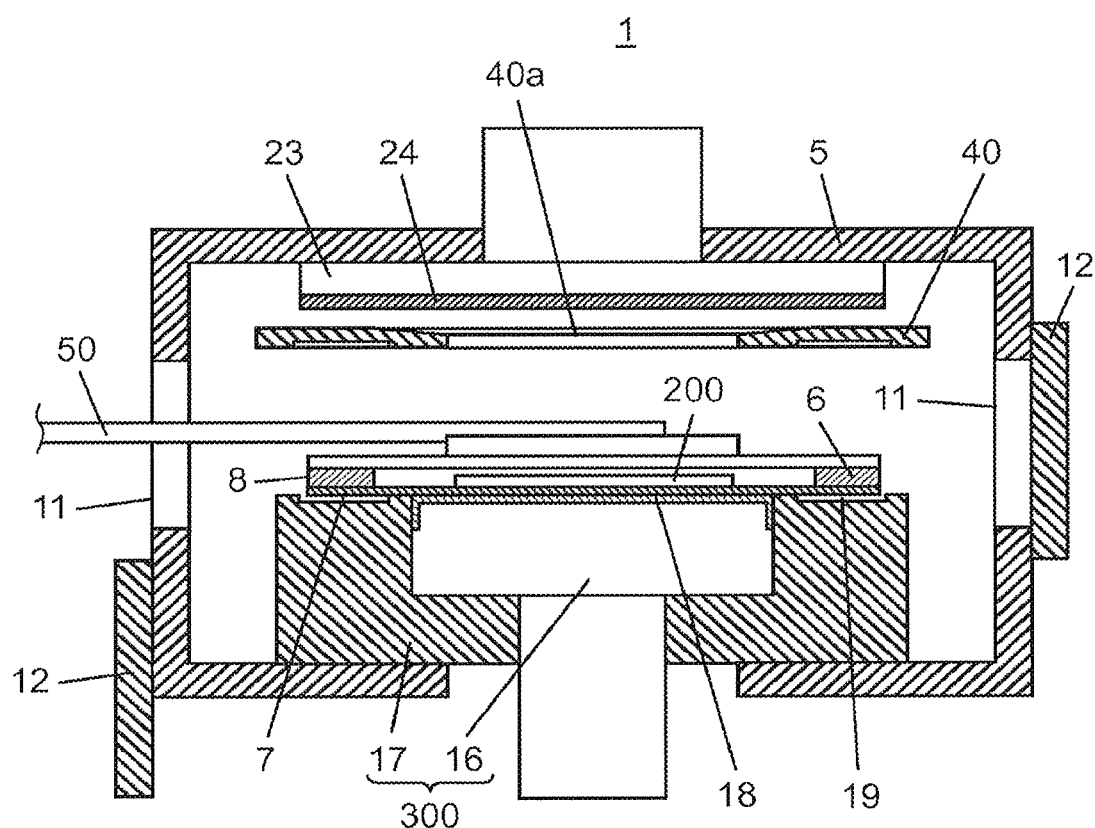
FIG. 8 is a sectional front view of the plasma processing device in accordance with the exemplary embodiment of the present invention.
Figure 9:
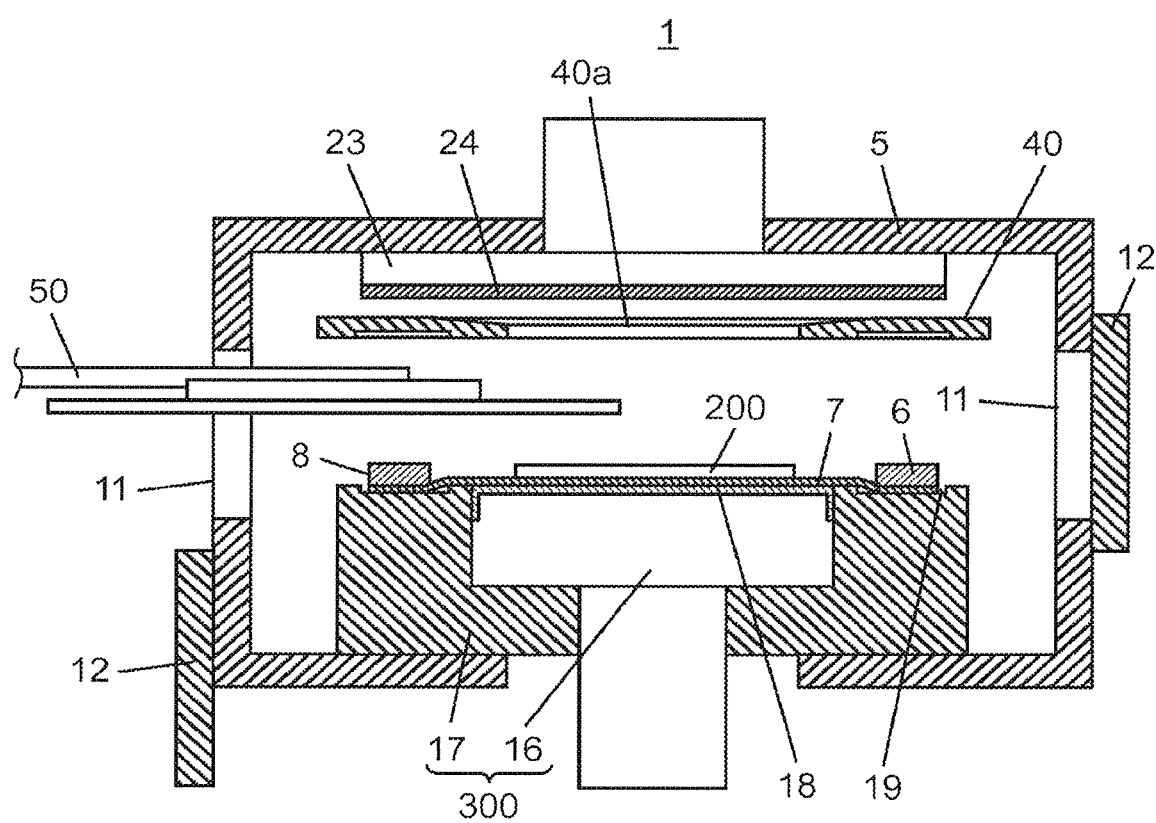
FIG. 9 is a sectional front view of the plasma processing device in accordance with the exemplary embodiment of the present invention.

FIGS. 7 through 9 are sectional front views of the plasma processing device in accordance with the exemplary embodiment of the present invention. In FIG. 7, suction carrier tool 50 with framed wafer 8 stuck is horizontally inserted through one of mouths 11 so that framed wafer 8 is located above stage 300. In FIG. 8, suction carrier tool 50 is moved down so that holder frame 6 of framed wafer 8 has a position right above groove 19 formed on table 17 of stage 300. In FIG. 9, releasing vacuum suction of suction carrier tool 50 allows holder frame 6 of framed wafer 8 to fit into groove 19 by self weight. Through the procedures so far, wafer 200 is mounted on lower electrode 16.

As described earlier, the position and the size of groove 19 are determined to be met with holder frame 6 of framed wafer 8 fitted in when framed wafer 8 is mounted on stage 300 in a manner that the center of framed wafer 8 substantially aligns with the center of stage 300. Therefore, fitting holder frame 6 of framed wafer 8 into groove 19 allows framed wafer 8 to be mounted on stage 300 with substantial alignment of the center of framed wafer 8 (i.e., the center of wafer 200) and the center of stage 300 (i.e., the center of lower electrode 16) in a vertical direction.

After the completion of mounting framed wafer 8 on stage 300, suction carrier tool 50 is unloaded from vacuum chamber 5. Controller 14 effects control of gate-open/close driving section 15 so that one of gates 12, which is disposed at the currently open mouth of mouths 11, moves up to close the mouth.

With mouths 11 closed, controller 14 effects control of cover-member up/down driving section 35 so that cover member 40 is moved down. Along the way of moving down, cover member 40 makes contact, from the upper direction, with the upper surface of holder frame 6 of framed wafer 8 mounted on stage 300 and settles at the holder-frame contact position. After cover member 40 makes contact, from the upper direction, with the upper surface of holder frame 6 of framed wafer 8 mounted on stage 300 and settles at the holder-frame contact position, piston rods 34 go out of engagement with cover member 40, by which cover member 40 is left on holder frame 6. Holder frame 6 is pushed down on stage 300 by the self weight of cover member 40. That is, sandwiched between cover member 40 and stage 300, holder frame 6 is fixed on table 17 of stage 300 (see FIG. 1). Under the state where cover member 40 is positioned at the holder-frame contact position, the upper surface of holder frame 6 of framed wafer 8 is covered with cover member 40 from the upper direction, at the same time, wafer 200 is exposed to the outside from opening 40a formed in the center of cover member 40. At that time, inner periphery 40b of opening 40a of cover member 40 horizontally faces outer periphery 2a of wafer 200 (see FIG. 5). Besides, inner periphery 40b of opening 40a of cover member 40 is adjacent to outer periphery 2a of wafer 200, and the area-exposed between outer periphery 2a of wafer 200 and inner periphery 6a of holder frame 6 of adhesive sheet 7 is almost covered with inner peripheral section 40c around opening 40a of cover member 40 that horizontally extends at a distance from adhesive sheet 7 (see FIG. 5). That is, keeping a distance from adhesive sheet 7, cover member 40 partly covers (almost covers in the embodiment) an area of adhesive sheet 7, which is exposed between outer periphery 2a of wafer 200 and inner periphery 6a of holder frame 6.

In FIG. 5; indicates the vertical distance between the lower surface of inner peripheral section 40c around opening 40a of cover member 40 and the upper surface of adhesive sheet 7; similarly, L indicates the horizontal distance between inner periphery 40b of opening 40a of cover member 40 and inner periphery 6a of holder frame 6. Under the state where cover member•40 makes contact, from the upper direction, with the upper surface of holder frame 6 and is positioned at the holder-frame contact position, vertical distance and horizontal distance 1 are such that plasma may be hard to reach holder frame 6 under cover member 40 even if entering through the area between outer periphery 2a of wafer 200 and inner periphery 40b of opening 40a of cover member 40.

After wafer 200 as an object to be treated is mounted on lower electrode 16 of stage 300, controller 14 effects control of vacuum ventilation section 32 so as to exhaust air from vacuum chamber 5 to maintain a vacuum therein. Next, controller 14 effects control of process-gas supply section 31 so as to supply upper electrode 23 with process gas (i.e., a fluorine••based gas and an oxygen••based gas). Passing through porous plate 24, the process gas is evenly sprayed over the upper surface of wafer•200 mounted on stage 300. Under the condition above, controller 14 drives high-frequency power•supply 21 to apply high-frequency voltage to lower•electrode 16. The application of high-frequency voltage generates plasma of fluorine-based gas between lower electrode 16 and upper electrode 23. Wafer 200 thus undergoes plasma treatment.

During the plasma treatment, cover member 40 covers the upper surface of holder frame 6 that is made of metal or the like and holds the periphery of adhesive sheet 7, preventing plasma generated in vacuum chamber 5 from concentrating at hold frame 6. During the plasma treatment, controller 14 effects control of cooling unit 22 so as to circulate coolant in lower electrode 16. This protects wafer 200 from temperature increase caused by heat of plasma.

On the completion of plasma treatment of wafer 200, controller 14 effects control of process-gas supply section 31 so as to stop the supply of process gas to vacuum chamber 5. At the same time, controller 1.4 effects control of vacuum ventilation section 32 so as to break a vacuum in vacuum chamber 5. Controller 14 effects control of cover-member up/down driving section 35 so as to move piston rods 34 of two elevating cylinders 33 to the upper limit position. This allows cover member 40 to be placed at the highest position. Next, operation control of controller 14 opens one of gates 12 for one of mouths 11. Suction carrier tool 50 is inserted through the opened mouth into vacuum chamber 5. In a manner similar to that in loading the wafer into vacuum chamber 5, framed wafer 8 is attached with suction force to suction carrier tool so. Suction carrier tool 50 with framed wafer 8 is unloaded from vacuum chamber 5 through the opened one of mouths 11. After that, controller 14 closes the gate on the side of the opened mouth. In this way, a series of operation is completed.

Framed wafer 8 after plasma treatment is not necessarily unloaded through the mouth used for loading framed wafer 8 before plasma treatment. For example, framed wafer 8 may be unloaded through the other mouth, which is disposed opposite to the mouth used for loading. Particularly, when the plasma treatment is carried out in an in-line process where plasma processing device 1 is connected to other devices, it is preferable that one mouth is used for loading and the other is used for unloading.

According to plasma processing device 1 of the exemplary embodiment, as described above, during plasma treatment of wafer 200 that is a to-be-treated object mounted on stage 300, holder frame 6 for holding adhesive sheet 7 is covered with dielectric cover member 40 placed at a predetermined position above stage 300 (i.e., at the holder-frame contact position). At the same time, wafer 200 is exposed from opening 40a formed in the center of cover member 40. The structure prevents plasma generated in vacuum chamber 5 from concentrating at holder frame 6; meanwhile, the plasma treatment on wafer 200 proceeds with no obstruction. As a result, performance of the plasma treatment on wafer 200 with holder frame 6 is improved.

Besides, according to plasma processing device 1 of the exemplary embodiment, cover member 40 is movable upward and downward above stage 300 by a pair of elevating cylinders 33 (elevating mechanism) disposed in vacuum chamber 5. Downward movement of the elevating mechanism allows cover member 40 to move down and make contact with holder frame 6 from upper direction and to be positioned at the aforementioned predetermined position (the holder-frame contact position). The structure offers easy positioning of cover member 40. Besides, the positioning of holder frame 6 on stage 300—which cannot be attained by wafer-holding mechanism 20—is easily obtained by the self weight of properly positioned cover member 40.

Placed at the predetermined position (holder-frame contact position), cover member 40 covers at least above an area of adhesive sheet 7 that is exposed between outer periphery 2a of wafer 200 and inner periphery 6a of holder frame 6. According to the embodiment, the exposed area described above corresponds to the annular-shaped area with width L shown in FIG. 5. The area of adhesive sheet 7 between outer periphery 2a of wafer 200 and inner periphery 6a of holder frame 6 is almost covered with cover member 40. When the distance between outer periphery 2a of wafer 200 and inner periphery 6a of holder•frame 6 is determined to be relatively large in consideration of handling of wafer 200 in a subsequent process (for example, in the expanding process after dicing), the exposed area of adhesive sheet 7 is affected by plasma over a wide range. That is, exposure to plasma invites deterioration caused by thermal distortion or variations in degree of expansion of adhesive sheet 7 in the expanding process, which hampers easy handling of framed wafer 8 after plasma treatment. According to plasma processing device 1 of the embodiment, however, cover member 40 covers above the aforementioned part and protects it from plasma exposure. That is, the structure of the embodiment addresses the problems above.

In the description above, cover member 40 serves as a cover that covers the upper surface of holder frame 6 from the upper direction because framed wafer 8 is the object to be treated. In a case where the object to be treated is wafer 200 without holder frame 6 (but with a diameter the same as that of wafer 200 of framed wafer 8), positioning cover member 40 in advance at the stage contact position on stage 300 allows the cover member to be a positioning target for properly locating wafer 200 on stage 300.

Figure 10:
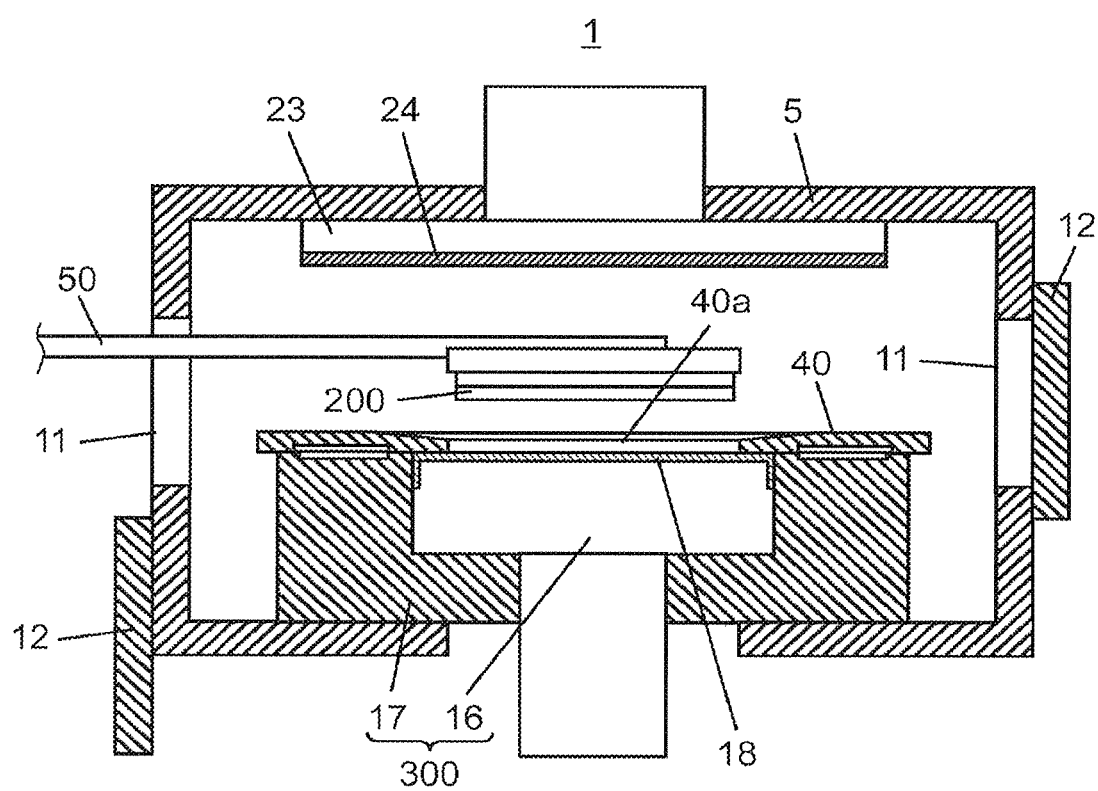
FIG. 10 is another sectional front view of the plasma processing device in accordance with the exemplary embodiment of the present invention.
Figure 11:
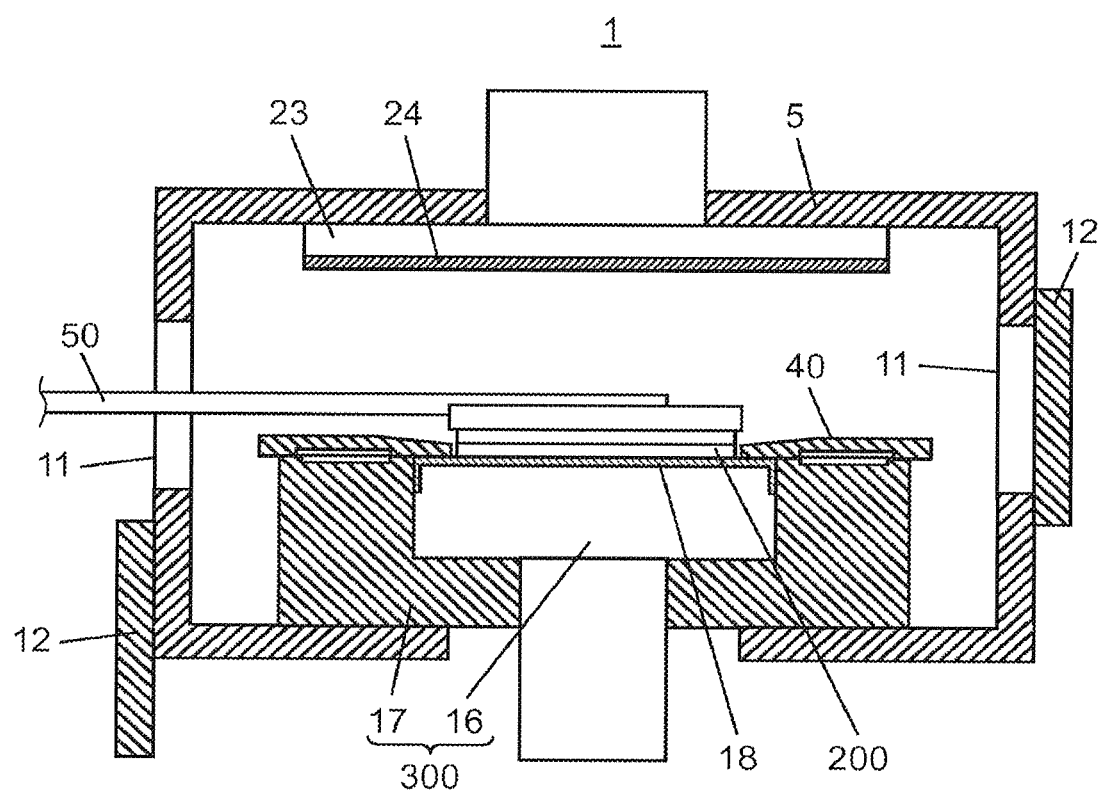
FIG. 11 is still another sectional front view of the plasma processing device in accordance with the exemplary embodiment of the present invention.
Figure 12:
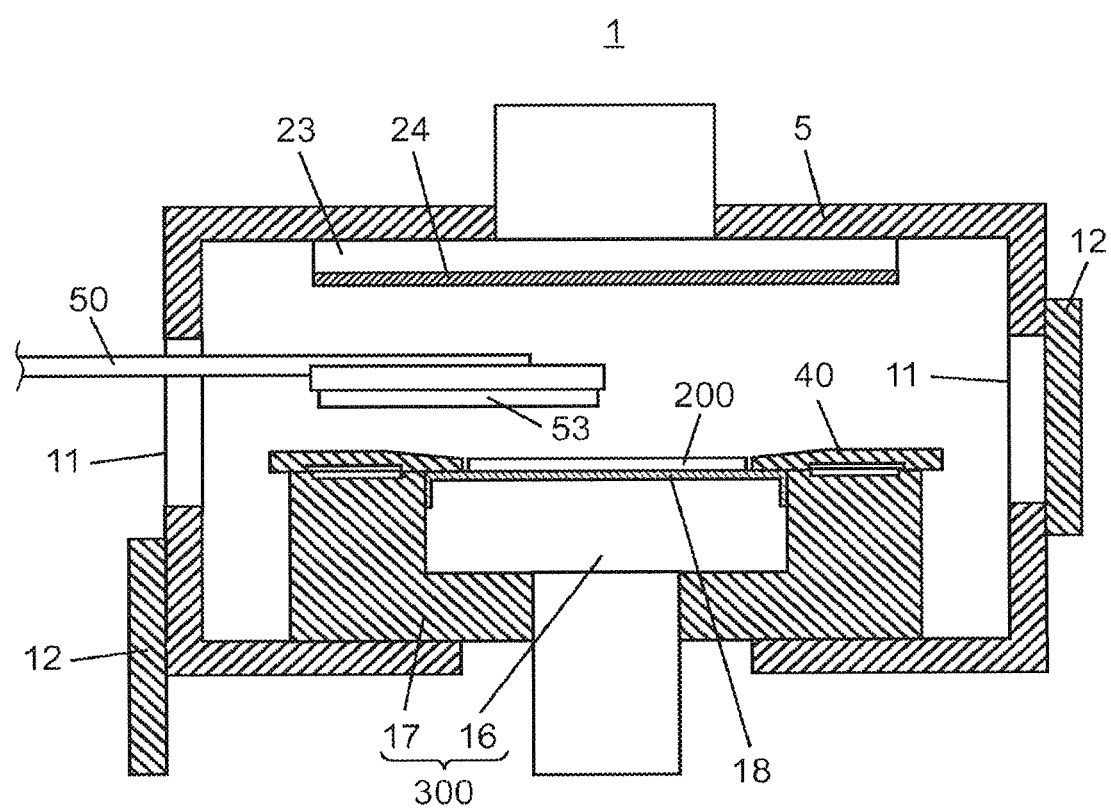
FIG. 12 is yet another sectional front view of the plasma processing device in accordance with the exemplary embodiment of the present invention.

FIGS. 10 through 12 are sectional front views of another plasma processing device in accordance with the exemplary embodiment of the present invention. In FIG. 10, controller 14 effects control of cover-member up/down driving section 35 so as to locate cover member 40 above stage 300. Wafer 200, which is attached with suction force to suction carrier tool 50, is loaded into vacuum chamber 5 through an opened mouth of mouths 11 and is positioned above stage 300. In FIG. 11, suction carrier tool 50 is moved down in a manner that outer periphery 2a of wafer 200 fits within opening 40a of cover member 40 and then vacuum suction of suction carrier tool 50 is released. In FIG. 12, wafer 200 is located on stage 300 (i.e., on lower electrode 16 covered with dielectric film 18) in a manner that the center of wafer 200 substantially aligns with the center of lower electrode 16 of stage 300 in a vertical direction.

Plasma processing device 1 of the embodiment, as described above, copes with both of wafer 200 with holder frame 6 and wafer 200 without holder frame 6. When wafer 200 with holder frame 6 is used, cover member 40 covers, from the upper direction, the upper surface of holder frame 6 not only to prevent concentration of plasma at holder frame 6 made of metal or the like, but also to protect adhesive sheet 7 from degradation caused by plasma exposure. When wafer 200 without holder frame 6 is used, cover member 40 serves as a positioning member for mounting wafer 200 on lower electrode 16 of stage 300.

As described earlier, the upper surface of lower electrode 16 is covered with dielectric film 18. In addition, as is shown in FIG. 10, lower electrode 16 has an outer shape greater than the area in stage 300 surrounded by opening 40a (specifically, the area formed by projecting opening 40a of cover member 40 onto stage 300). That is, the area-surrounded by opening 40a of cover member 40 when cover member 40 is positioned on stage 300-is covered with dielectric film 1.8. Therefore, even when lower electrode 16 has a diameter greater than wafer 200, the (upper) surface of lower electrode 16 has no plasma exposure. As a result, the plasma treatment on wafer 200 as the object to be treated proceeds with no obstruction that can be caused by concentration of plasma at the surface of lower electrode 16.

While the invention has been shown in the embodiment, it is not limited to the structure described above. For example, according to the structure introduced in the embodiment above, the upper surface of lower electrode 16 is covered with dielectric film 18 (that is a film member made of dielectric material). If plasma treatment does not carried out on wafer 200 without holder frame 6, the structure does not necessarily require dielectric film 18.

In the structure of the embodiment above, cover member 40 is movable upward and downward above stage 300 by a pair of elevating cylinders 33 (elevating mechanism) disposed in vacuum chamber 5. Moving-down movement of the elevating mechanism allows cover member 40 to make contact with holder frame 6 from the upper direction, by which cover member 40 is located at the aforementioned predetermined position (the holder-frame contact position). However; cover member 40 is not necessarily brought into contact with holder frame 6 from the upper direction. For example, holder frame 6 may be located at a predetermined position (the holder-frame contact position) by a pair of elevating cylinders 33, with no contact of cover member 40 with holder frame 6 from the upper direction.

Further, the device does not necessarily have the structure where cover member 40 is moved up and down by the elevating mechanism disposed in vacuum chamber 5. For example, an operator may take on the task of, for example, manually loading (unloading) cover member 40 in (from) vacuum chamber 5 and mounting cover member 40 onto holder frame 6 of framed wafer 8 on stage 300.

Still further, in the embodiment above, framed wafer 8 is mounted on stage 300 in a manner that wafer 200 is positioned above adhesive sheet 7. However, framed wafer 8 may be mounted on stage 300 in an upside down position in a manner that wafer 200 is positioned below adhesive sheet 7. When framed wafer 8 is mounted on stage 300 in the upside down position, plasma treatment follows the procedures below. A groove is formed on adhesive sheet 7 so as to be along a dicing line of wafer 200 by application of laser light along the dicing line from the side of adhesive sheet 7; after that, framed wafer 8 is mounted on stage 300 of plasma processing device 1; next, with holder•frame 6 held by cover member 40 from the upper direction, plasma-etching is applied to wafer 200, with adhesive sheet 7 acting as an etch mask, so that wafer 200 undergoes plasma dicing where wafer 200 is divided into a plurality of chips.

INDUSTRIAL APPLICABILITY

In a case where a to-be-treated object with a holder frame undergoes plasma treatment, the present invention is useful for providing a plasma processing device that prevents concentration of plasma at the holder frame and enhances performance of the treatment.

The invention claimed is:
1. A method for plasma processing a wafer, the method comprising:
   providing a work piece, the work piece having a wafer, a holding sheet and a frame, the frame holding the holding sheet, the holding sheet holding the wafer;
   providing a plasma processing apparatus, the plasma processing apparatus having a chamber, an electrode for generating plasma, a stage above which the work piece is placed, a cover member, and a carrier tool for loading the work piece to the stage, the cover member having an opening that exposes the wafer loaded above the stage in plan view;
   loading the work piece to the stage by using the carrier tool, such that the carrier tool supports a portion of the work piece overlapped by the frame without making contact with the wafer;
   generating plasma by the electrode; and
   plasma-processing the wafer by the generated plasma,
   wherein in the plasma-processing step, the cover member covers an upper surface of the frame by making contact with the upper surface of the frame while keeping a distance from and not touching the holding sheet and exposing the wafer through the opening.

2. The method of claim 1, further comprising:
unloading the work piece from the stage after the plasma-processing,
wherein the unloading is carried out by using the carrier tool, such that the carrier tool supports the portion of the work piece overlapped by the frame without making contact with the wafer.

3. The method of claim 1,
wherein an upper surface of the stage includes a first region and a second region surrounding the first region,
the wafer is mounted within the first region and the holder frame is mounted on the second region, and
the cover member covers a portion of the holding sheet over second region and the first region.

4. The method of claim 1,
wherein the cover member has an upper surface of the cover member and a lower surface of the cover member opposite to the upper surface of the cover member, the upper surface of the cover member being exposed to the plasma, and
wherein the lower surface of the cover member includes a first annular lower surface and a second annular lower surface, the first annular lower surface is disposed closer to the opening than the second annular lower surface, and the first annular lower surface is disposed lower than the second annular lower surface.

5. The method of claim 1, further comprising:
changing a distance between the cover member and the stage after the loading of the work piece, so that the distance during the plasma-processing becomes smaller than the distance during the loading.

6. A plasma processing apparatus comprising:
a chamber;
an electrode generating plasma in the chamber;
a stage disposed in the chamber, and a work piece is capable of being placed above the stage, the work piece having a wafer, a holding sheet holding the wafer and a frame holding the holding sheet;
a cover member having an opening, an upper surface and a lower surface, the cover member disposed above the holding sheet and the frame, the upper surface being exposed to the plasma; and
a carrier tool for loading the work piece to the stage, wherein:
loading of the work piece to the stage by the carrier tool is performed such that the carrier tool supports a portion of the work piece overlapped by the frame without making contact with the wafer, and
the cover member covers an upper surface of the frame by making contact with the upper surface of the frame while keeping a distance from and not touching the holding sheet and exposing the wafer through the opening during plasma processing.

7. The plasma processing apparatus of claim 6,
wherein unloading of the work piece from the stage by the carrier tool is performed such that the carrier tool supports the portion of the work piece overlapped by the frame without making contact with the wafer.

8. The plasma processing apparatus of claim 6,
wherein an upper surface of the stage includes a first region and a second region surrounding the first region,
the wafer is mounted within the first region and the frame is mounted on the second region, and
the cover member covers a portion of the holding sheet over second region and the first region.

9. The plasma processing apparatus of claim 6,
wherein the cover member has an upper surface of the cover member and a lower surface of the cover member opposite to the upper surface of the cover member, the upper surface of the cover member being exposed to the plasma, and
wherein the lower surface of the cover member includes a first annular lower surface and a second annular lower surface, the first annular lower surface is disposed closer to the opening than the second annular lower surface, and the first annular lower surface is disposed lower than the second annular lower surface.

10. The plasma processing apparatus of claim 6,
wherein a distance between the cover member and the stage during plasma-processing is smaller than the distance during the loading.

* * * * *